(12) United States Patent
Miksch et al.

(10) Patent No.: US 6,960,719 B2
(45) Date of Patent: Nov. 1, 2005

(54) METHOD AND APPARATUS FOR MITIGATING ELECTROMAGNETIC WAVES

(75) Inventors: Eugene Arthur Miksch, Loveland, CO (US); Robert J. Blakely, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 130 days.

(21) Appl. No.: 10/689,127

(22) Filed: Oct. 20, 2003

(65) Prior Publication Data

US 2005/0082074 A1    Apr. 21, 2005

(51) Int. Cl.$^7$ ................................. H05K 9/00
(52) U.S. Cl. ................. 174/35 GC; 361/816; 361/818
(58) Field of Search ......................... 179/35 GC, 35 C, 179/35 R; 361/799, 800, 816, 818, 752, 753, 361/807

(56) References Cited

U.S. PATENT DOCUMENTS

| | | | | |
|---|---|---|---|---|
| 5,231,562 A | * | 7/1993 | Pierce et al. | 361/832 |
| 5,243,493 A | * | 9/1993 | Jeng et al. | 361/690 |
| 5,568,362 A | * | 10/1996 | Hansson | 361/736 |
| 6,621,717 B2 | * | 9/2003 | Tuttle et al. | 361/818 |

* cited by examiner

Primary Examiner—Dean A. Reichard
Assistant Examiner—Carmelo Oliva

(57) ABSTRACT

The present invention is directed to a method and apparatus for mitigating electromagnetic waves emanating from an electronic device. The apparatus comprises a cover member, a bight extending from one end of the cover member, and a retaining plate spaced from the cover member and connected to the bight to provide a biasing force away from the cover member and towards an electronic device. The cover member is configured to overlie an opening in the chassis of the electronic device and the retaining plate is configured to abut cabling extending out of the chassis. In this way, the apparatus attenuates electromagnetic waves radiating emanating from an opening in a chassis of an electronic device and conducted along cabling as a noise signal superimposed upon the intended signal.

17 Claims, 3 Drawing Sheets

METHOD AND APPARATUS FOR MITIGATING ELECTROMAGNETIC WAVES

BACKGROUND OF THE INVENTION

This invention relates generally to a cover for an electronic device and, more particularly, to an apparatus for mitigating electromagnetic energy both emanating from an electronic device and dispersed from the cabling extending from the electronic device.

DESCRIPTION OF THE RELATED ART

In the operation of electronic devices, electromagnetic energy, typically radio frequency energy, is generated in addition to intended electrical signals. This energy is undesirable and, if strong enough, has the ability to interfere with radio communications or the operation of nearby electronic apparatus. The Federal Communications Commission (FCC) regulates electromagnetic energy radiating from an electronic device. Computer equipment sold in the United States must demonstrate compliance with FCC electromagnetic radiated emission levels, and thus computer equipment typically includes electromagnetic energy containment features, such as a metallic enclosure, to block the emission of this energy from the device.

Computer products present a unique set of issues relating to electromagnetic compatibility. Modern computing systems often have a number of external devices, such as keyboards, network connections, disk drives, etc., that are interfaced with a main computer housing or chassis. Typically, a cabling system is implemented to allow the computer to communicate with or supply power to such external devices. The cables extend through openings in the EMC enclosure to reach external devices, and consequently breach the electromagnetic containment enclosure. Electromagnetic energy escapes the chassis through these openings. The metallic cables also conduct electromagnetic energy from sources within the chassis and disperse this energy outside the chassis.

SUMMARY OF THE INVENTION

In an embodiment of the present invention, an apparatus for mitigating electromagnetic energy emanating from an electronic device comprises a cover member, a bight extending from one end of the cover member, and a retaining plate spaced from the cover member and connected at a fixed end to the bight. The cover member is configured to overlie an opening in the chassis of an electronic device and the retaining plate is configured to provide a biasing force away from the cover member and towards the electronic device to secure cabling extending out of the chassis against the chassis.

The present invention provides an apparatus that is easy to install on an electronic device and mitigates electromagnetic radiation emanating from the device. The apparatus attenuates both the escape of electromagnetic radiation from an opening in the EMC enclosure and the electromagnetic energy conducted along cabling extending from the electronic device and dispersed outside the chassis.

Other advantages and components of the present invention will become apparent from the following description taken in conjunction with the accompanying drawings, which constitute a part of this specification and wherein are set forth exemplary embodiments of the present invention to illustrate various objects and features thereof.

DETAILED DESCRIPTION OF THE INVENTION

Figure 1:
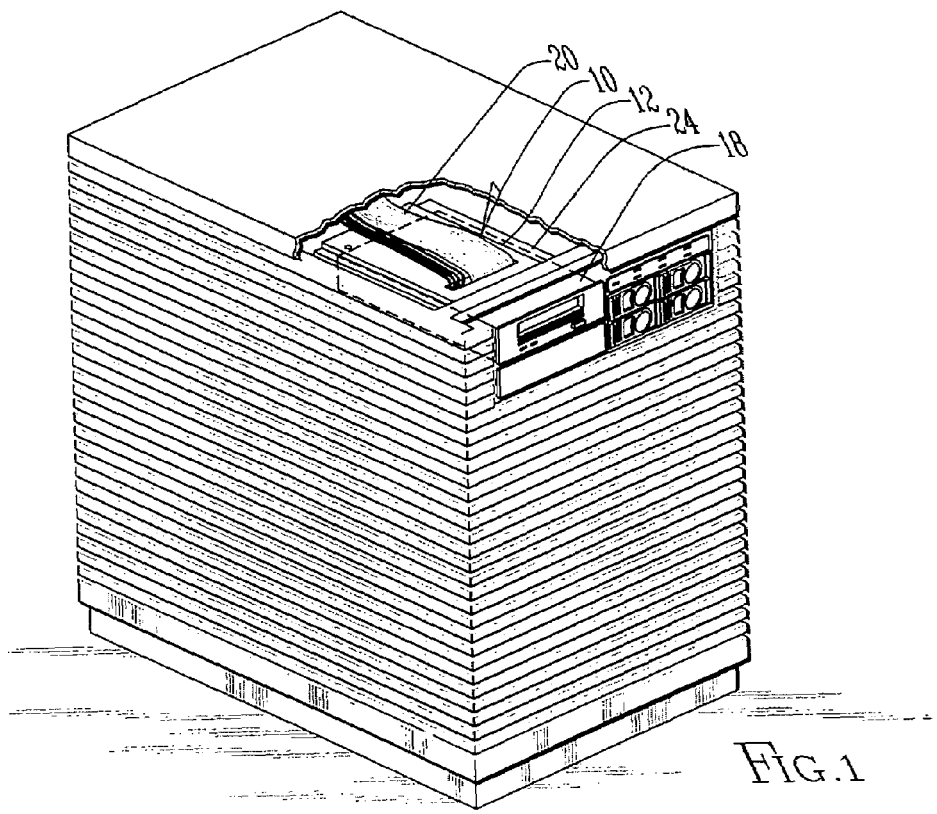
FIG. 1 is a perspective view of a computer system chassis with a portion cut-away to show cabling extending through an opening of the EMC chassis.
Figure 2:
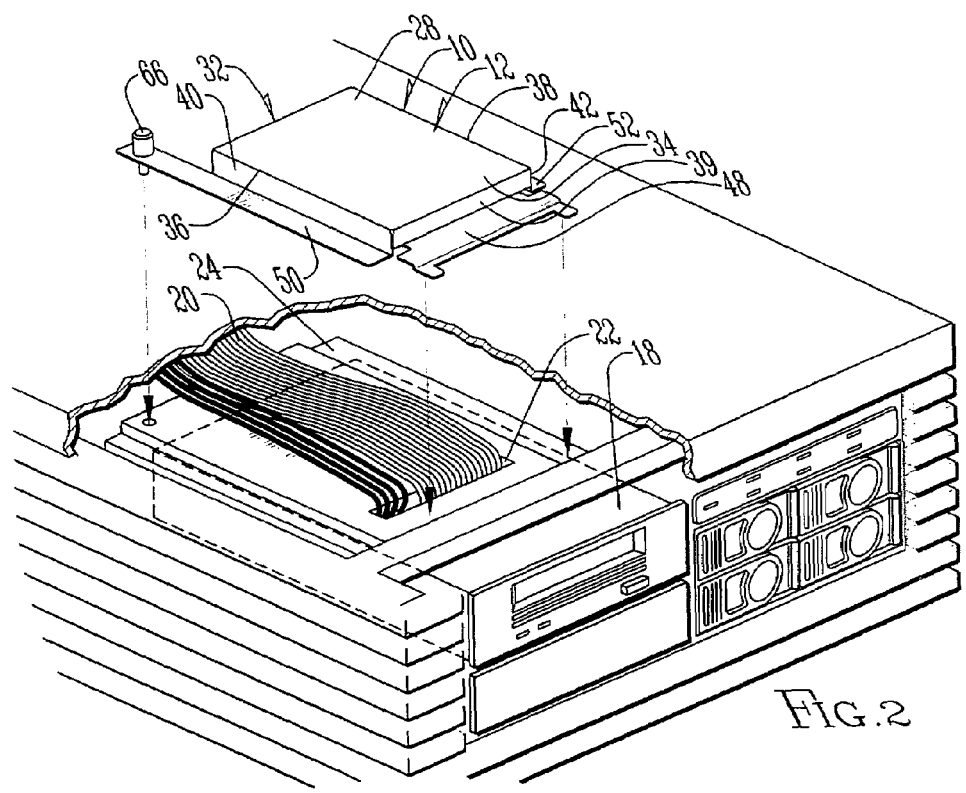
FIG. 2 is a perspective view of the computer system chassis with an apparatus according to an exemplary embodiment of the present invention shown exploded therefrom.
Figure 3:
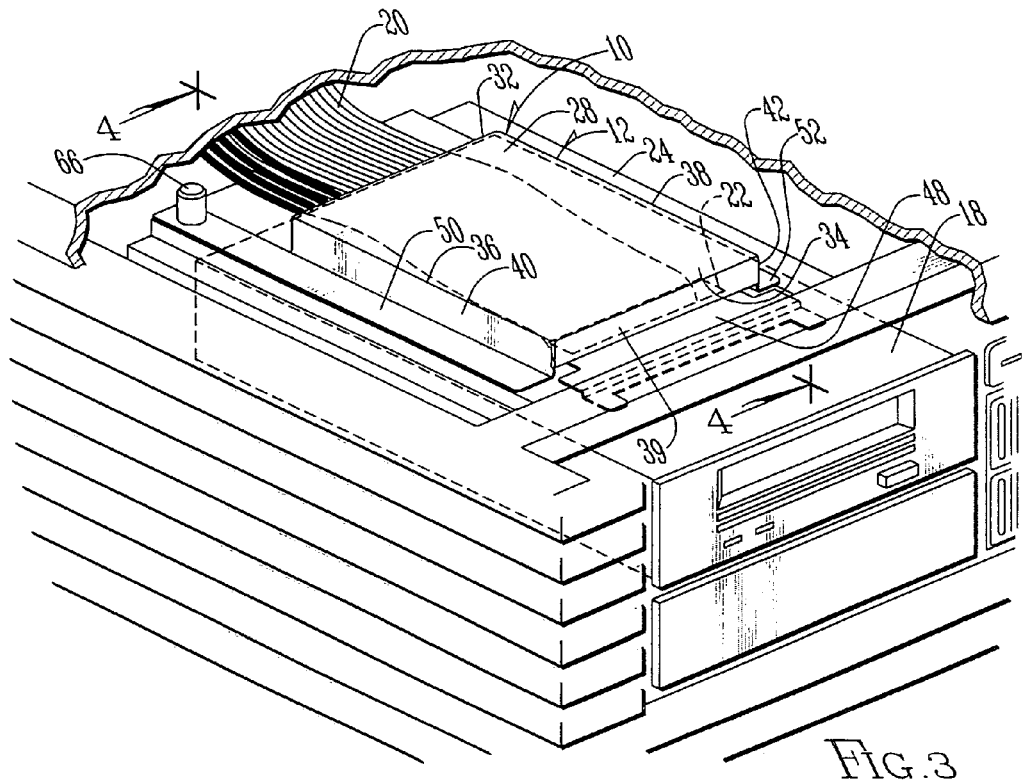
FIG. 3 is a perspective view of the computer system chassis with the exemplary apparatus mounted to the chassis.
Figure 4:
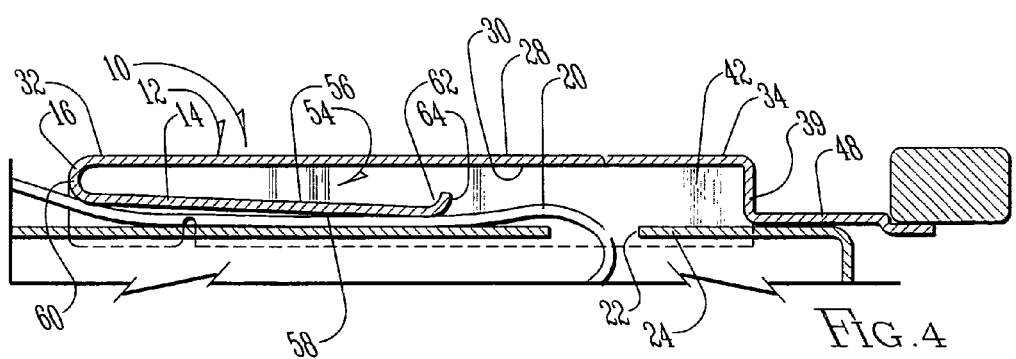
FIG. 4 is a cross-sectional view of the exemplary apparatus taken along line 4—4 of FIG. 3.
Figure 5:
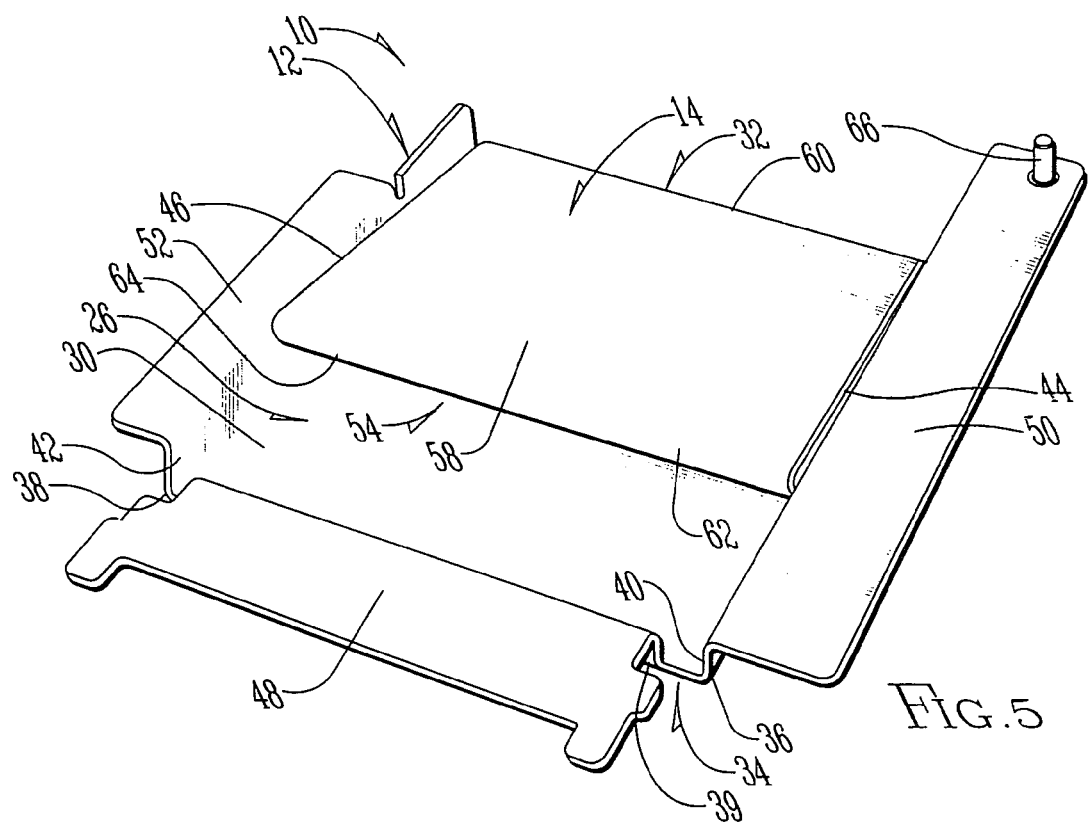
FIG. 5 is a bottom perspective view of the exemplary apparatus.

An electromagnetic energy shielding apparatus in accordance with an embodiment of the present invention is indicated generally at 10. As best shown in FIGS. 4 and 5, the apparatus 10 comprises a cover member 12, a retaining plate 14, and a bight 16. When mounted to an electronic device 18, as shown in FIG. 4, apparatus 10 is configured to bias the retaining plate 14 against cabling 20 extending out of an opening 22 in the EMC containment chassis 24 of the device 18. The retaining plate 14 minimizes the gap between the cabling 20 and the chassis as the cabling enters or exits the apparatus 10. Further, the overall configuration of the apparatus 10 significantly reduces the escape routes available for electromagnetic energy to disperse out of the apparatus.

In the exemplary embodiment, the apparatus 10 is formed of a single piece of sheet metal and is shaped into the configuration necessary for effective electromagnetic energy attenuation. The cover member 12 is a generally planar member configured to overlie the opening 22 in the chassis 24. The cover member 12 has a top surface 28 a bottom surface 30, a proximal end 32, a distal end 34, and side edges 36, 38. End wall 39, first side wall 40, and second side wall 42 are planar members extending substantially perpendicularly downwardly from the cover member 12 toward chassis 24 when the apparatus is mounted to the chassis. These walls 39, 40, 42 extend a span sufficient to position the cover member 12 a distance above the EMC containment chassis 24 as to allow the underlying interconnected retaining plate 14 to deflect inwardly and generate a sufficient biasing force to pin cabling extending from the opening against the chassis. Further, these walls 39, 40, 42 combine with the retaining plate 14 to block electromagnetic energy from propagating laterally out from underneath the cover member 12. It is to be understood that the end wall 39 and first and second side walls 40, 42 could extend in a non-perpendicular relationship to the cover member 12 without departing from the invention.

End wall 39 and first and second side walls 40, 42 have base flanges 48, 50, 52, respectively, that extend outwardly from the walls to provide a support surface for mounting the apparatus 10 to the EMC containment chassis 24. These base flanges 48, 50, 52 are generally configured to be parallel to the surface of the chassis 24 to which the apparatus will be mounted. This allows the base flanges 48, 50, 52 to lie flat against the chassis 24 and provide a stable surface for mounting the apparatus 10 to the chassis. The base flanges 48, 50, 52 can be of any configuration, but should be designed as to properly lie against the chassis 24. Base flanges 48, 50, 52 are provided with attachment means generally indicated at 66, such as fasteners or adhesives, to secure the apparatus 10 to the chassis 24. It is to be understood that other attachment means may be used, such as, for example slots or grooves formed in the chassis 24 and adapted to receive flanges 48, 50, 52.

The retaining plate 14 is a generally rectangular, planar member extending substantially beneath the cover member 12 and between the first and second side walls 40, 42. The retaining plate 14 has a top surface 56 facing towards the cover member 12 and a bottom surface 58 facing towards the EMC containment chassis 24 when the apparatus 10 is mounted to the electronic device 18. Preferably, retaining plate 14 extends substantially the entire span between first and second walls 40, 42 to minimize escape routes for the electromagnetic energy. The retaining plate 14 comprises a fixed end 60, which is integrally connected to bight 16, and a free end 62. The retaining plate preferably has an upwardly extending lip 64 at the free end to prevent the retaining plate 14 from compromising the integrity of the cabling 20, such as by cutting the cabling.

Bight 16 extends generally downward from the proximal end 32 of the cover member 12 to retaining plate 14. The bight 16 comprises a curved bend that can flex and provide a biasing force to the retaining plate 14. The stiffness of bight 16 should be sufficiently high as to provide the biasing force necessary for the retaining plate 14 to pin cabling 20 extending from opening 22 against the chassis 24 and thereby minimize gaps between the cabling and the chassis. The bight 16 stiffness, however, should not be so high as to prevent cabling 20 of various heights to be positioned between the retaining plate 14 and the chassis 24. The height of the bight 16 is sufficiently large as to define a chamber 54 between the cover member 12 and retaining plate 14 for containing electromagnetic energy emanating from the opening 22 in the chassis 24. In the alternative embodiment, the bight 16 can be formed of a straight flange that would primarily flex at the juncture between the flange and each of the cover member 12 and retaining member 14 to provide the necessary biasing force.

As shown in FIG. 5, the retaining plate 14 in the unflexed position (i.e., when the apparatus 10 is not mounted to the chassis 24) slopes downward from the bight 16 to the free end 62. Upon mounting of the apparatus 10 to the chassis 24, as depicted in FIG. 4, the retaining plate 14 flexes upwardly to receive the cabling 20 extending along the chassis 24 and creates a downward biasing force pushing the cabling 20 against chassis 24. The retaining plate 14 and cabling block the electromagnetic energy from travelling underneath the retaining plate and the energy is contained by the cover member 12, the retaining plate 14, the bight 16, the end wall 39, and the first and second side walls 40, 42.

The chassis 24 is constructed of metal and is electrically grounded. In one configuration, the cover member 12 is made of a non-conductive material, such as plastic. In this configuration, the routed cables and the chassis are capacitively coupled. Specifically, the wires internal of the cables and the metal chassis serve as conductors and the insulation of the cables serves as the dielectric. The high-frequency noise superimposed on the wire by the electromagnetic energy in the chassis is routed to the EMC chassis 24 and then conducted to ground due to capacitive coupling. The low-frequency intended signal continues along the cabling to the desired endpoint. The electromagnetic energy mitigation is maximized in this configuration by pinning the cabling adjacent to the chassis to minimize the separation between the conductive wires and the chassis. Further, since retaining plate 14 preferably extends the span between walls 40, 42 and, as shown in FIG. 4, extends longitudinally for a portion of the apparatus, a broad area of contact between the cables and the chassis is formed. This maximizes the area of contact between the cables and the chassis and provides effective capacitive coupling to route electromagnetic energy from the cables to the chassis while having a minimal effect on the intended signal transmitted through the cables.

If the electromagnetic energy mitigation needs are greater, a higher degree of control is available by the assembly 10 of the present invention. The apparatus 10 may also be formed of metal and electrically grounded to the EMC chassis 24. The bottom surface 58 of the retaining plate 14 abuts the cabling 20 for substantially the entire length of the plate 14 to maximize the contact area between the cabling 20 and the plate 14 for capacitive coupling. The cable is thus capacitively coupled with both the chassis 24 and the apparatus 10. This increases the contact area between the cable 20 and the conductor (i.e. the chassis and the apparatus) and thus increases the capacitive coupling.

From the foregoing information, it should now be obvious that the electromagnetic energy shielding apparatus 10 provides a simple, efficient and easy-to-install solution for mitigating electromagnetic energy emanating from an opening in a chassis of an electronic device and conducted along cabling extending to and from the electronic device. The assembly 10 further provides a shield that is configured to effectively work with variety of different types and sizes of cables.

It is also to be understood that the end wall 39 and first and second side wall 40, 42 could be removed from the present invention and structure provided on the surface of the EMC containment chassis 24 to serve the function of blocking electromagnetic waves from propagating laterally out from underneath the cover member 12. The present invention is also not limited to configurations where the apparatus 10 is mounted on a horizontal surface such that the cover member 12 is positioned vertically above an opening 22 in an EMC containment chassis 24, but also includes vertical mounting of the apparatus 10 such that the cover member 12 is horizontally spaced from the opening 22. Furthermore, while certain forms of the present invention have been illustrated and described herein, it is not to be limited to the specific forms or arrangement of parts described and shown.

What is claimed:

1. An apparatus for mitigating electromagnetic energy emanating from an electronic device, the apparatus comprising:
   a cover member having a proximal end and a distal end;
   a retaining plate having a top surface, a bottom surface, a free end, and a fixed end, the retaining plate being spaced from the cover member and the bottom surface being configured to abut an electronic component extending from an opening in the electronic device; and
   a bight coupling the fixed end of the retaining plate to the proximal end of cover member and configured to provide the retaining plate with a biasing force away from the cover member.

2. The apparatus of claim 1, wherein the retaining plate biasing force minimizes the free space around cabling as such cabling passes between the retaining plate bottom surface and an enclosure of the electronic device when the apparatus is mounted to the enclosure.

3. The apparatus of claim 1, wherein the electronic component is a cable.

4. The apparatus of claim 1, wherein the apparatus is substantially formed of conductive material to enhance the effectiveness of the apparatus in mitigating electromagnetic energy emanating from the electronic device.

5. The apparatus of claim 1, wherein the cover member further comprises first and second side walls extending from opposite side edges of the cover member towards the plane of the retaining plate, the first and second side walls having a length and height sufficient to further reduce the amount of electromagnetic energy dispersing out of the apparatus as the apparatus is mounted to an enclosure of the electronic device.

6. The apparatus of claim 5, wherein the first and second side walls are arranged in a generally perpendicular orientation to the cover member.

7. The apparatus of claim 5, further comprising an end wall extending from the distal end of the cover member towards the enclosure as the apparatus is mounted to the enclosure, the end flange having a length and height sufficient to further reduce the amount of electromagnetic energy dispersing out of the apparatus from inside the apparatus when the apparatus is mounted to the enclosure.

8. The apparatus of claim 5, further comprising first and second base flanges extending from the first and second side walls in a plane parallel to the cover member to provide surfaces for mounting the apparatus to the electronic device enclosure.

9. The apparatus of claim 1, further comprising an attachment means connected to the cover member to mount the apparatus to an enclosure of the electronic device.

10. The apparatus of claim 1, wherein the free end of the retaining plate comprises a curved lip extending towards the cover member.

11. An apparatus for mitigating electromagnetic energy emanating from an electronic device, the apparatus comprising:
    a first planar member having a proximal end and a distal end;
    a return bend disposed at the proximal end of the first planar member and extending downward; and
    a second planar member having a top surface, a bottom surface, a free end, and a fixed end, the second planar member connected to the return bend at the fixed end and generally disposed below the first planar member, the bottom surface being configured to abut an electronic component extending from an opening of the electronic device;
    wherein the first planar member, the second planar member, and the return bend are cooperatively configured to provide a biasing force towards an enclosure of the electronic device to hold the electronic component between the retaining plate bottom surface of the second planar member and the enclosure when the apparatus is mounted to the enclosure of the electronic device.

12. The apparatus of claim 11, further comprising first and second side walls extending from opposite side edges of the first planar member towards the second planar member.

13. The apparatus of claim 11, further comprising an end wall extending from the distal end of the first planar member towards the second planar member.

14. The apparatus of claim 12, further comprising first and second base flanges extending outwardly from the first and second side walls in a plane parallel to the first planar member to provide surfaces for mounting the apparatus onto the electronic device enclosure.

15. A method for mitigating electromagnetic energy emanating from an electronic device comprising the steps of:
    forming a cover member having a proximal end and a distal end;
    forming a retaining plate having a top surface, a bottom surface, a free end, and a fixed end, the retaining plate being spaced from the cover member and the bottom surface being configured to abut an electronic component extending from an opening of an enclosure of the electronic device; and
    forming an interconnection between the fixed end of the retaining plate and the proximal end of cover member, the interconnection providing a biasing force for the retaining plate away from the cover member;
    placing the interconnected cover member and retaining plate over the opening in the electronic device and over a portion of the electronic component extending from the opening to hold the electronic component between the retaining plate bottom surface and the electronic device enclosure; and
    mitigating the electromagnetic energy present in the enclosure by capacitive coupling.

16. The method of claim 15, further comprising the step of mounting the interconnected cover member and retaining plate to the enclosure of the electronic component.

17. The method of claim 16, wherein the step of forming a retaining plate comprises forming the retaining plate with a length and width sufficient to mitigate electromagnetic energy from dispersing from an opening of the electronic device.

* * * * *